(12) United States Patent
Khlat et al.

(10) Patent No.: US 10,637,399 B2
(45) Date of Patent: Apr. 28, 2020

(54) LOW MODULATION BANDWIDTH ENVELOPE TRACKING CIRCUIT

(71) Applicant: Qorvo US, Inc., Greensboro, NC (US)

(72) Inventors: Nadim Khlat, Cugnaux (FR); Manbir Singh Nag, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/048,473

(22) Filed: Jul. 30, 2018

(65) Prior Publication Data

US 2019/0319584 A1 Oct. 17, 2019

Related U.S. Application Data

(60) Provisional application No. 62/658,660, filed on Apr. 17, 2018.

(51) Int. Cl.
*H03F 1/02* (2006.01)
*H03F 3/19* (2006.01)
*H03F 3/21* (2006.01)
*H02M 3/07* (2006.01)

(52) U.S. Cl.
CPC .......... *H03F 1/02* (2013.01); *H03F 3/19* (2013.01); *H03F 3/21* (2013.01); *H02M 3/07* (2013.01); *H03F 2200/102* (2013.01); *H03F 2200/375* (2013.01); *H03F 2200/451* (2013.01)

(58) Field of Classification Search
CPC ..................................................... H03F 1/0211

USPC ................................. 330/127, 285, 296, 297
See application file for complete search history.

(56) References Cited

U.S. PATENT DOCUMENTS

| 8,803,605 | B2 * | 8/2014 | Fowers | ................ | H03F 1/0238 |
| | | | | | 330/136 |
| 9,379,667 | B2 * | 6/2016 | Khlat | ................... | H03G 3/3042 |
| 2012/0313701 | A1 * | 12/2012 | Khlat | .................... | H02M 3/07 |
| | | | | | 330/127 |

* cited by examiner

*Primary Examiner* — Henry Choe
(74) *Attorney, Agent, or Firm* — Withrow & Terranova, P.L.L.C.

(57) ABSTRACT

A low modulation bandwidth (LMB) envelope tracking (ET) circuit is provided. The LMB ET circuit is configured to generate an ET modulated voltage at an output node based on a modulated target voltage for amplifying an LMB radio frequency (RF) signal. More specifically, the LMB ET circuit includes an amplifier configured to generate a modulated amplifier voltage based on the modulated target voltage and an offset circuit configured to raise the modulated amplifier voltage by a modulated offset voltage at the output node. The offset circuit is configured to generate the modulated offset voltage based on a modulated target offset voltage that is proportional to the modulated target voltage. As a result, it may be possible to maintain the ET modulated voltage at a defined voltage level for a defined duration such that the LMB RF signal can be amplified to a defined power level.

20 Claims, 4 Drawing Sheets

LOW MODULATION BANDWIDTH ENVELOPE TRACKING CIRCUIT

RELATED APPLICATIONS

This application claims the benefit of provisional patent application Ser. No. 62/658,660, filed Apr. 17, 2018, the disclosure of which is hereby incorporated herein by reference in its entirety.

FIELD OF THE DISCLOSURE

The technology of the disclosure relates generally to envelope tracking (ET) circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Concurrent to supporting the wide-area wireless communication technologies, such as long-term evolution (LTE) and fifth-generation new radio (5G-NR), the mobile communication devices may form an Internet-of-Things (IoT) network with a number of non-conventional communication devices (e.g., vehicle, home appliances, sensors, etc.) to enable a variety of human-machine interactive applications. In contrast to the RF signals communicated in a wide-area wireless network, RF signals communicated in the IoT network are often modulated at a lower modulation bandwidth (e.g., less than 180 KHz) and communicated sporadically as opposed to being communicated periodically or continuously.

Envelope tracking (ET) is a technique whereby an ET modulated voltage is provided to an amplifier circuit for amplifying the RF signal. The ET modulated voltage is associated with a time-variant voltage envelope that tracks closely a time-variant amplitude envelope of the RF signal being amplified. In this regard, the peaks and lows of the ET modulated voltage can be generated in accordance to the peaks and lows of the RF signal to help improve linearity and efficiency of the amplifier circuit. However, it may be challenging to maintain the ET modulated voltage at a peak level for a sufficient duration (e.g., 2 micro seconds) for amplifying a lower modulation bandwidth (e.g., <180 KHz) RF signal to a defined power level (e.g., +26 dBm), particularly when the ET modulated voltage is generated based on a lower battery voltage (e.g., <3.2 V). As such, it may be desirable to maintain the ET modulated voltage at the peak level for the desired duration without compromising error vector magnitude (EVM) of the amplifier circuit.

SUMMARY

Embodiments of the disclosure relate to a low modulation bandwidth (LMB) envelope tracking (ET) circuit. In examples discussed herein, the LMB ET circuit is configured to generate an ET modulated voltage at an output node based on a modulated target voltage for amplifying an LMB (e.g., <180 KHz) radio frequency (RF) signal. More specifically, the LMB ET circuit includes an amplifier configured to generate a modulated amplifier voltage based on the modulated target voltage and an offset circuit configured to raise the modulated amplifier voltage by a modulated offset voltage at the output node. The offset circuit is configured to generate the modulated offset voltage based on a modulated target offset voltage that is proportional to the modulated target voltage. In this regard, both the ET modulated voltage and the modulated offset voltage may rise and fall in accordance to the modulated target voltage. As a result, it may be possible to maintain the ET modulated voltage at a defined voltage level for a defined duration such that the LMB RF signal can be amplified to a defined power level for transmission, for example, in an Internet-of-Things (IoT) network.

In one aspect, an LMB ET circuit is provided. The LMB ET circuit includes an input node configured to receive a modulated target voltage. The LMB ET circuit also includes an output node configured to output an ET modulated voltage corresponding to the modulated target voltage. The LMB ET circuit also includes an amplifier configured to generate a modulated amplifier voltage at an amplifier output based on the modulated target voltage. The LMB ET circuit also includes an offset circuit coupled between the amplifier output and the output node. The offset circuit is configured to receive a modulated target offset voltage proportional to the modulated target voltage. The offset circuit is also configured to cause a modulated offset voltage being generated between the amplifier output and the output node based on the modulated target offset voltage such that the ET modulated voltage is maintained at a defined voltage level for a defined duration.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a low modulation bandwidth (LMB) envelope tracking (ET) circuit. In examples discussed herein, the LMB ET circuit is configured to generate an ET modulated voltage at an output node based on a modulated target voltage for amplifying an LMB (e.g., <180 KHz) radio frequency (RF) signal. More specifically, the LMB ET circuit includes an amplifier configured to generate a modulated amplifier voltage based on the modulated target voltage and an offset circuit configured to raise the modulated amplifier voltage by a modulated offset voltage at the output node. The offset circuit is configured to generate the modulated offset voltage based on a modulated target offset voltage that is proportional to the modulated target voltage. In this regard, both the ET modulated voltage and the modulated offset voltage may rise and fall in accordance to the modulated target voltage. As a result, it may be possible to maintain the ET modulate voltage at a defined voltage level for a defined duration such that the LMB RF signal can be amplified to a defined power level for transmission, for example, in an Internet-of-Things (IoT) network.

Before discussing the LMB ET circuit of the present disclosure, a brief overview of an existing ET circuit is first discussed with reference to FIGS. 1A and 1B to help understand the challenges associated with generating an ET modulated voltage for amplifying an IoT communication signal having a lower modulation bandwidth. The discussion of specific exemplary aspects of the LMB ET circuit according to the present disclosure starts below with reference to FIG. 2.

Figure 1A:
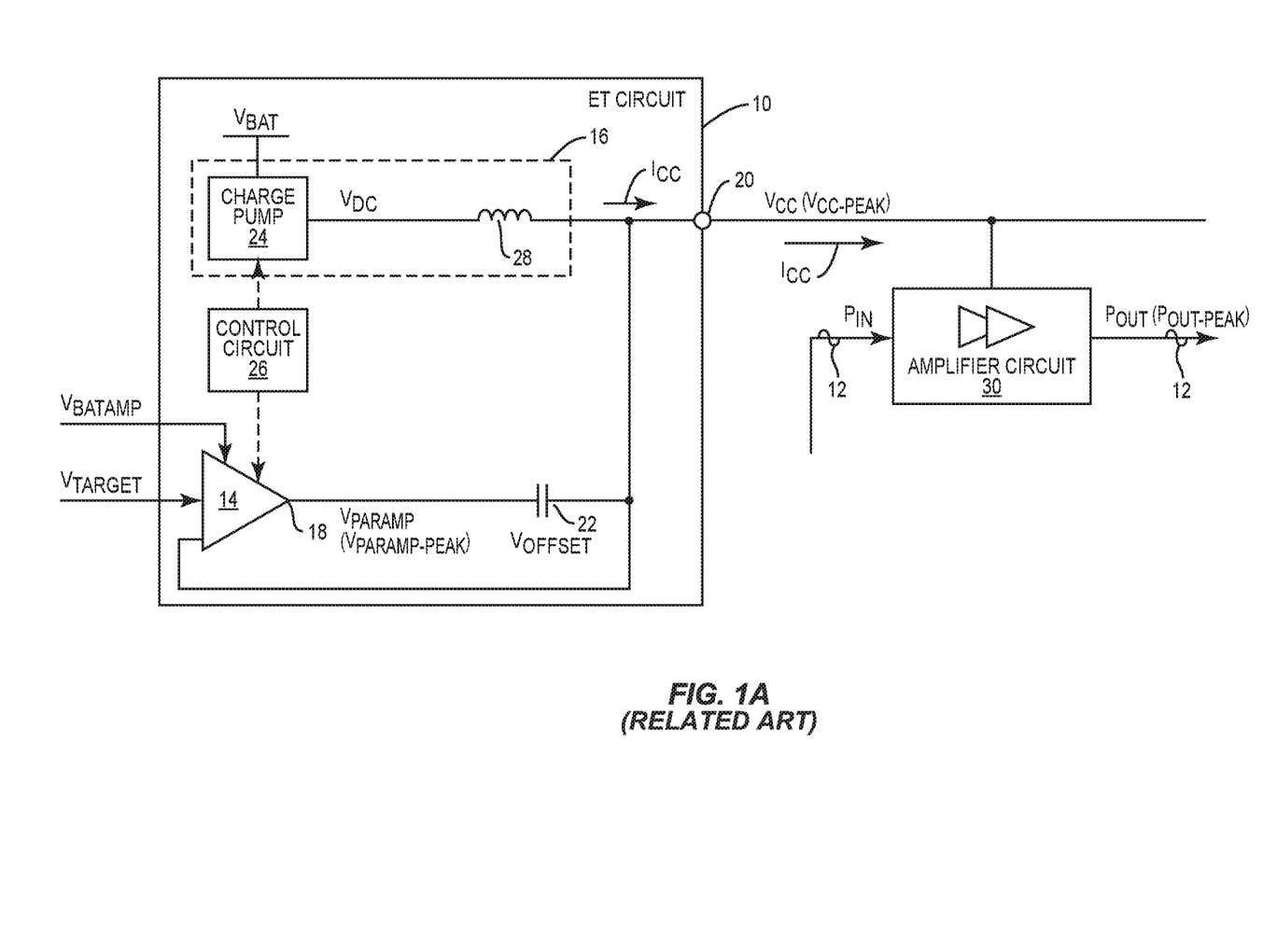
FIG. 1A is a schematic diagram of an exemplary existing envelope tracking (ET) circuit that may be incapable of maintaining an ET modulated voltage at a desired peak level for a sufficient duration required to amplify a radio frequency (RF) signal modulated in a lower modulation bandwidth.

In this regard, FIG. 1A is a schematic diagram of an exemplary existing ET circuit 10 that may be incapable of maintaining an ET modulated voltage $V_{CC}$ at a desired peak level for a sufficient duration required to amplify an RF signal 12 modulated in a lower modulation bandwidth. The existing ET circuit 10 includes an amplifier 14 and a charge pump circuit 16.

The amplifier 14 is configured to generate a modulated amplifier voltage $V_{PARAMP}$ at an amplifier output 18 based on a modulated target voltage $V_{TARGET}$ and a supply voltage $V_{BATAMP}$. In a non-limiting example, the modulated target voltage $V_{TARGET}$ can be provided in the form of a differential voltage and the supply voltage $V_{BATAMP}$ can be a constant voltage. The amplifier output 18 is coupled to an output node 20 of the existing ET circuit 10 via an offset capacitor 22. The offset capacitor 22 is configured to raise the modulated amplifier voltage $V_{PARAMP}$ by an offset voltage $V_{OFFSET}$ to generate the ET modulated voltage $V_{CC}$ at the output node 20. In this regard, the offset voltage $V_{OFFSET}$ can be expressed in equation (Eq. 1) below.

$$V_{OFFSET} = V_{CC} - V_{PARAMP} \qquad \text{(Eq. 1)}$$
$$= V_{CC\text{-}PEAK} - V_{PARAMP\text{-}PEAK}$$

In the equation (Eq. 1) above, $V_{CC\text{-}PEAK}$ and $V_{PARAMP\text{-}PEAK}$ represent a peak level of the ET modulated voltage $V_{CC}$ and a peak level of the modulated amplifier voltage $V_{PARAMP}$, respectively. The supply voltage $V_{BATAMP}$ can be determined based on equations (Eq. 2.1 and Eq. 2.2) below.

$$V_{BATAMP} = V_{PARAMP\text{-}PEAK} + P_{HEADROOM} \qquad \text{(Eq. 2.1)}$$
$$= V_{CC\text{-}PEAK} - V_{OFFSET} + V_{HR} \qquad \text{(Eq. 2.2)}$$

In the equation (Eq. 2), $P_{HEADROOM}$ represents a predefined voltage headroom. In a non-limiting example, $P_{HEADROOM}$ and $V_{OFFSET}$ can be pre-configured to be approximately 0.2 V and approximately 0.8 V, respectively. Accordingly, the offset capacitor 22 can raise the modulated amplifier voltage $V_{PARAMP}$ by approximately 1 V to generate the ET modulated voltage $V_{CC}$ at the output node 20. From equations (Eq. 2.1 and Eq. 2.2) above, $V_{CC\text{-}PEAK}$ and $P_{HEADROOM}$ can be further expressed as equations (Eq. 3 and Eq. 4) below.

$$V_{CC\text{-}PEAK} = V_{BATAMP} + V_{OFFSET} - P_{HEADROOM} \qquad (\text{Eq. 3})$$

$$P_{HEADROOM} = V_{OFFSET} + V_{BATAMP} - V_{CC\text{-}PEAK} \qquad (\text{Eq. 4})$$

The charge pump circuit 16 includes a charge pump 24, which can be a direct current (DC) to DC (DC-DC) buck-boost circuit for example. The charge pump 24 is configured to generate a DC voltage $V_{DC}$ based on a battery voltage $V_{BAT}$. In a non-limiting example, the battery voltage $V_{BAT}$ is lower than 3.2 volts (<3.2 V).

The existing ET circuit 10 includes a control circuit 26, which may further include a bang-bang controller (BBC) (not shown) for controlling the charge pump circuit 16 and an ET controller (ETC) (not shown) for controlling the amplifier 14. The control circuit 26 may control the charge pump 24 to generate the DC voltage $V_{DC}$ at various levels. In a non-limiting example, the control circuit 26 can control the charge pump 24 to generate the DC voltage $V_{DC}$ at 0 V, $V_{BAT}$, or $2 \times V_{BAT}$. The charge pump circuit 16 includes an inductor 28, which is configured to induce a current $I_{CC}$ at the output node 20 based on the DC voltage $V_{DC}$.

The output node 20 is coupled to an amplifier circuit 30. The amplifier circuit 30 is configured to amplify the RF signal 12 from an input power $P_{IN}$ to an output power $P_{OUT}$ based on the ET modulated voltage $V_{CC}$. In one non-limiting example, the RF signal 12 can be an Internet-of-Things (IoT) RF signal corresponding to the LMB (e.g., <180 KHz).

From time to time, the amplifier circuit 30 may need to amplify the RF signal 12 to a peak power level $P_{OUT\text{-}PEAK}$. In this regard, the existing ET circuit 10 is required to maintain the ET modulated voltage $V_{CC}$ at the peak level $V_{CC\text{-}PEAK}$ and generate the current $I_{CC}$ at a desired current level such that the amplifier circuit 30 can amplify the RF signal 12 to the peak power level $P_{OUT\text{-}PEAK}$. For example, the amplifier circuit 30 is required to amplify the RF signal 12 to a Class 2 output power in excess of 26 dBm. If the amplifier circuit 30 has 45% power amplifier efficiency (PAE) and the peak level of the ET modulated voltage $V_{CC}$ is at 5 V, the current $I_{CC}$ generated by the existing ET circuit 10 would need to be approximately 314.6 mA.

Initially, the charge pump circuit 16 is configured to provide the current $I_{CC}$ based on the battery voltage $V_{BAT}$. However, given that the battery voltage $V_{BAT}$ can be as low as 3.2 V (or even below 3.0 V), the DC voltage $V_{DC}$ may not be sufficient to drive the inductor 28 to generate the current $I_{CC}$ at the desired current level. As a result, the amplifier 14 may be forced to source a portion of the current $I_{CC}$ to make up for the deficit.

When the amplifier 14 starts to source the current $I_{CC}$, the offset capacitor 22 starts to discharge to cause the offset voltage $V_{OFFSET}$ to decrease. Thus, according to equation (Eq. 3) above, the predefined voltage headroom $P_{HEADROOM}$ needs to decrease proportionally to maintain the ET modulated voltage $V_{CC}$ at the peak level $V_{CC\text{-}PEAK}$. However, when the $P_{HEADROOM}$ is reduced to 0 V, there will be no more voltage headroom left to compensate for further decrease in the offset voltage $V_{OFFSET}$. As a result, the existing ET circuit 10 is no longer able to maintain the ET modulated voltage $V_{CC}$ at the peak level $V_{CC\text{-}PEAK}$. Consequently, the ET modulated voltage $V_{CC}$ may be clipped, thus causing the amplifier circuit 30 to become incapable of amplifying the RF signal 12 to the peak power level $P_{OUT\text{-}PEAK}$.

Figure 1B:
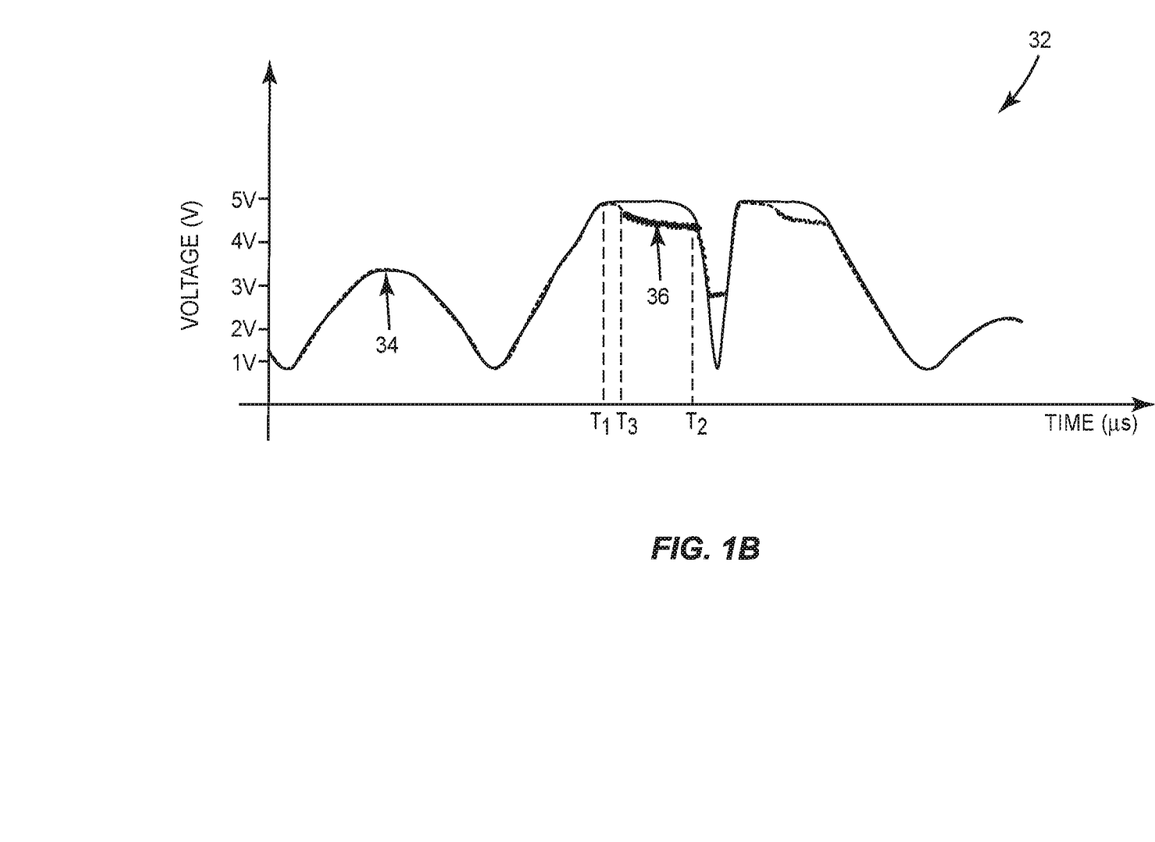
FIG. 1B is a graphic diagram providing an exemplary illustration of the ET modulate voltage that decreases over time as a result of an offset capacitor discharging in the existing ET circuit of FIG. 1A.

FIG. 1B is a graphic diagram 32 providing an exemplary illustration of the ET modulated voltage $V_{CC}$ that decreases over time as a result of the offset capacitor 22 discharging in the existing ET circuit 10 of FIG. 1A. Elements of FIG. 1A are referenced in conjunction with FIG. 1B and will not be re-described herein.

The graphic diagram 32 includes an ideal voltage curve 34 and an actual voltage curve 36. As illustrated by the ideal voltage curve 34, the existing ET circuit 10 is required to maintain the ET modulated voltage $V_{CC}$ at approximately 5 V between time $T_1$ and $T_2$. However, as illustrated by the actual voltage curve 36, the ET modulated voltage $V_{CC}$ begins to decrease at time $T_3$ ($T_1 < T_3 < T_2$) due to discharging of the offset capacitor 22. In other words, the existing ET circuit 10 is only able to maintain the ET modulated voltage $V_{CC}$ at the 5 V level between time $T_1$ and $T_3$. In a non-limiting example, the duration between time $T_1$ and $T_3$ can be approximately 15 microseconds (µs).

When the RF signal 12 is modulated at a higher modulation bandwidth (e.g., ≥180 KHz), the existing ET circuit 10 only needs to maintain the ET modulate voltage $V_{CC}$ at the 5 V level for approximately 5 µs. In this regard, given that the existing ET circuit 10 is capable of maintaining the ET modulated voltage $V_{CC}$ at the 5 V level for a longer duration, the voltage drop as illustrated by the actual voltage curve 36 may not adversely impact the amplifier circuit 30.

However, when the RF signal 12 is an IoT RF signal, the RF signal 12 is typically modulated at a modulation bandwidth well below 180 KHz (e.g., between 3.75 to 15 KHz). In this regard, it may be necessary for the existing ET circuit 10 to maintain the ET modulated voltage $V_{CC}$ at the 5 V level for as long as 280 µs, which far exceeds the ability of the existing ET circuit 10. Hence, it may be desirable to enhance the existing ET circuit 10 such that the peak level of the ET modulated voltage $V_{CC}$ can be maintained for a sufficient duration to amplify a lower modulation bandwidth RF signal to a desired peak power level.

Figure 2:
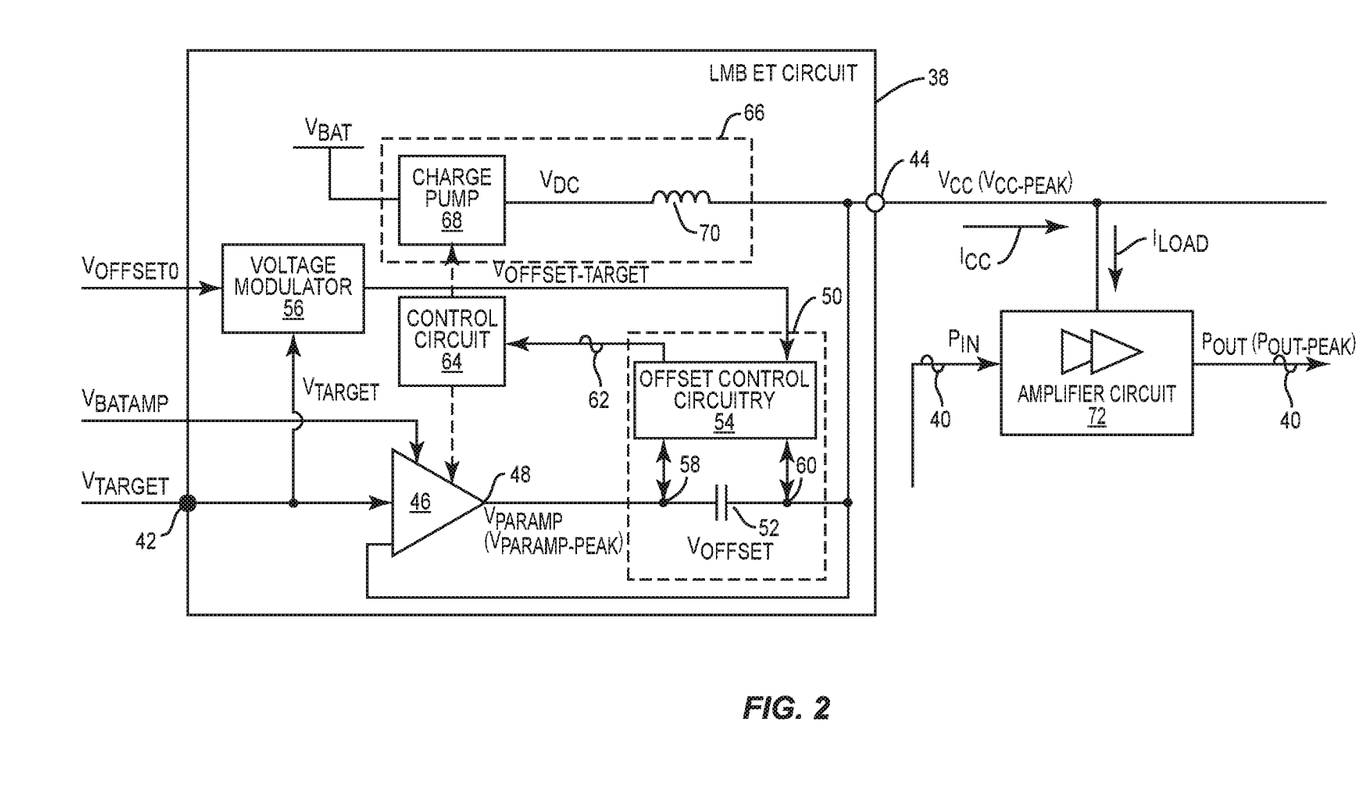
FIG. 2 is a schematic diagram of an exemplary low modulation bandwidth (LMB) ET circuit configured according to one embodiment of the present disclosure to maintain an ET modulated voltage at a defined voltage level for a defined duration that is sufficient for amplifying an LMB radio frequency (RF) signal to a defined power level.

In this regard, FIG. 2 is a schematic diagram of an exemplary LMB ET circuit 38 configured according to one embodiment of the present disclosure to maintain an ET modulated voltage $V_{CC}$ at a defined voltage level for a defined duration that is sufficient for amplifying an LMB RF signal 40 to a defined power level $P_{OUT}$. In examples discussed hereinafter, the defined power level corresponds to a peak power level $P_{OUT\text{-}PEAK}$ (e.g., 26 dBm). Accordingly, the defined voltage level corresponds to a peak level of the ET modulated voltage $V_{CC}$ (referred to as "$V_{CC\text{-}PEAK}$") (e.g., 5 V). Furthermore, the defined duration may be 280 µs. It should be appreciated that the operation principles discussed herein with reference to $P_{OUT\text{-}PEAK}$ and $V_{CC\text{-}PEAK}$ are applicable to other power and voltage levels as well.

The LMB ET circuit 38 includes an input node 42 configured to receive a modulated target voltage $V_{TARGET}$. The LMB ET circuit 38 also includes an output node 44 configured to output the ET modulated voltage $V_{CC}$ and a current $I_{CC}$. The LMB ET circuit 38 includes an amplifier 46 configured to generate a modulated amplifier voltage $V_{PARAMP}$ at an amplifier output 48 based on a supply voltage $V_{BATAMP}$ and the modulated target voltage $V_{TARGET}$. In a non-limiting example, the supply voltage $V_{BATAMP}$ is determined based on the equation (Eq. 2.1) above.

The LMB ET circuit 38 includes an offset circuit 50 coupled between the amplifier output 48 and the output node 44. In a non-limiting example, the offset circuit 50 includes an offset capacitor 52 and offset control circuitry 54 coupled in parallel between the amplifier output 48 and the output node 44. The offset circuit 50 is configured to generate a modulated offset voltage $V_{OFFSET}$ across the offset capacitor 52 based on a modulated target offset voltage $V_{OFFSET-TARGET}$. The modulated offset voltage $V_{OFFSET}$ is configured to raise the modulated amplifier voltage $V_{PARAMP}$ to the ET modulated voltage $V_{CC}$ at the output node 44. In this regard, the modulated offset voltage $V_{OFFSET}$ may correspond to a voltage differential between the ET modulated voltage $V_{CC}$ and the modulated amplifier voltage $V_{PARAMP}$.

As discussed in detail below, the offset circuit 50 receives a modulated target offset voltage $V_{OFFSET-TARGET}$ that is proportional to the modulated target voltage $V_{TARGET}$. In this regard, both the modulated offset voltage $V_{OFFSET}$ and the ET modulated voltage $V_{CC}$ may be generated in accordance to the modulated target voltage $V_{TARGET}$. Accordingly, when the ET modulated voltage $V_{CC}$ reaches the defined voltage level $V_{CC-PEAK}$, the modulated offset voltage $V_{OFFSET}$ may also increase proportionally. As a result, it may possible to prolong discharging time of the offset capacitor 52 when the amplifier 46 is sourcing a portion of the current $I_{CC}$, thus allowing the LMB ET circuit 38 to maintain the ET modulated voltage $V_{CC}$ at the peak level $V_{CC-PEAK}$ for an extended duration (e.g., 280 μs) that may be sufficient for amplifying the LMB RF signal 40 to the peak power level $P_{OUT-PEAK}$ for transmission, for example, in an IoT network.

The LMB ET circuit 38 includes a voltage modulator 56 coupled to the offset circuit 50. The voltage modulator 56 is configured to receive a copy of the modulated target voltage $V_{TARGET}$ from the input node 42 and scale the modulated target voltage $V_{TARGET}$ based on a predefined scaling factor k (0<k<1) to generate a scaled modulated target voltage $k*V_{TARGETS}$.

The voltage modulator 56 is further configured to modulate the scaled modulated voltage $k*V_{TARGET}$ with a predefined minimum offset voltage $V_{OFFSET0}$ to generate the modulated target offset voltage $V_{OFFSET-TARGET}$ and provide the modulated target offset voltage $V_{OFFSET-TARGET}$ to the offset circuit 50.

In a non-limiting example, the modulated target offset voltage $V_{OFFSET-TARGET}$ can be determined based on equation (Eq. 5) below.

$$V_{OFFSET-TARGET} = k*(V_{TARGET} - V_{TARGET-MIN}) + V_{OFFSET0} \quad (Eq. 5)$$
$$= \{V_{OFFSET0} - k*V_{TARGET-MIN}\} + \{k*V_{TARGET}\}$$

In the equation (Eq. 5) above, $V_{TARGET-MIN}$ represents a bottom level of the modulated target voltage $V_{TARGET}$. Accordingly, $k*V_{TARGET-MIN}$ can be seen as representing a scaled minimum target voltage. Notably, the term $\{V_{OFFSET0} - k*V_{TARGET-MIN}\}$ can be predetermined based on specific design parameters of the LMB ET circuit 38 and is thus referred to as a "static term" of the modulated offset voltage $V_{OFFSET}$. In contrast, the term $\{k*V_{TARGET}\}$, which represents the scaled modulated target voltage, is regarded as a "dynamic term" of the modulated offset voltage $V_{OFFSET}$.

The offset capacitor 52 in the offset circuit 50 has a first end 58 and a second end 60 coupled to the amplifier output 48 and the output node 44, respectively. The offset control circuitry 54, which can be a field-programmable gate array (FPGA) for example, is coupled in parallel to the offset capacitor 52 between the first end 58 and the second end 60. The offset control circuitry 54 receives the modulated target offset voltage $V_{OFFSET-TARGET}$ from the voltage modulator 56 and determines the modulated offset voltage $V_{OFFSET}$ based on the modulated target offset voltage $V_{OFFSET-TARGET}$. Subsequently, the offset control circuitry 54 causes the modulated offset voltage $V_{OFFSET}$ to be applied across the offset capacitor 52. Notably, the offset control circuitry 54 may apply the modulated offset voltage $V_{OFFSET}$ across the offset capacitor 52 directly or by means of auxiliary circuitries (not shown) in the LMB ET circuit 38.

In response to generating and applying the modulated offset voltage $V_{OFFSET}$ across the offset capacitor 52, it may also prevent the $P_{HEADROOM}$ from becoming negative when the offset capacitor 52 discharges. In a non-limiting example, the $P_{HEADROOM}$ in the LMB ET circuit 38 can be determined by equation (Eq. 6) below.

$$P_{HEADROOM} = \{V_{OFFSET0} - k*V_{TARGET-MIN}\} + (k-1)*V_{CC}\} + V_{BATAMP} \quad (Eq. 6)$$

In this regard, when the ET modulated voltage $V_{CC}$ is maintained at a bottom (minimum) voltage level $V_{CC-MIN}$, then $P_{HEADROOM}$ equals approximately $\{V_{OFFSET0} - V_{CC-MIN} + V_{BATAMP}\}$. In contrast, when the ET modulated voltage $V_{CC}$ is maintained at the peak voltage level $V_{CC-PEAK}$, then $P_{HEADROOM}$ equals approximately $\{V_{OFFSET0} - V_{CC-PEAK} + V_{BATAMP} + k*(V_{CC-PEAK} - V_{TARGET-MIN})\}$. In either case, the LMB ET circuit 38 is able to maintain the $P_{HEADROOM}$ at a positive level.

By being coupled between the first end 58 and the second end 60, the offset control circuitry 54 may also receive the modulated amplifier voltage $V_{PARAMP}$ and the ET modulated voltage $V_{CC}$. In this regard, the offset control circuitry 54 may determine a voltage differential between the ET modulated voltage $V_{CC}$ and the modulated amplifier voltage $V_{PARAMP}$. Accordingly, the offset control circuitry 54 may generate an indication signal 62 indicative of the voltage differential.

The LMB ET circuit 38 may include a control circuit 64 configured to receive the indication signal 62 from the offset control circuitry 54. Accordingly, the control circuit 64 can control the amplifier 46 (e.g., increase or decrease the modulated amplifier voltage $V_{PARAMP}$) based on the voltage differential. In a non-limiting example, the control circuit 64 includes an ETC (not shown), which is dedicated for controlling the amplifier 46.

The LMB ET circuit 38 may further include a charge pump circuit 66 configured to generate and provide the current $I_{CC}$ to the output node 44. In a non-limiting example, the charge pump circuit 66 includes a charge pump 68, which can be a DC-DC buck-boost circuit, for example. The charge pump circuit 66 also includes an inductor 70 coupled in series to the charge pump 68. The charge pump 68 is configured to generate a DC voltage $V_{DC}$ based on a battery voltage $V_{BAT}$, which may be lower than 3.2 V.

The control circuit 64 may also includes a BBC (not shown) that is dedicated for controlling the charge pump circuit 66. The BBC may control the charge pump 68 to generate the DC voltage $V_{DC}$ at 0 V, at $V_{BAT}$, or at $2 \times V_{BAT}$. The inductor 70 is configured to induce the current $I_{CC}$ at the output node 20 based on the DC voltage $V_{DC}$.

The output node 44 may be coupled to an amplifier circuit 72. The amplifier circuit 72 is configured to amplify the LMB RF signal 40 from an input power level $P_{IN}$ to the defined power level $P_{OUT}$ based on the ET modulated voltage $V_{CC}$ and a load current $I_{LOAD}$.

In a non-limiting example, the amplifier circuit 72 needs to amplify the LMB RF signal 40 from the input power level $P_{IN}$ to the peak power level $P_{OUT-PEAK}$. In this regard, by applying the modulated offset voltage $V_{OFFSET}$ across the offset capacitor 52, it may be possible for the LMB ET circuit 38 to maintain the ET modulated voltage $V_{CC}$ at the peak level $V_{CC-PEAK}$ for the extended duration that may be sufficient to for amplifying the LMB RF signal 40 to the peak power level $P_{OUT-PEAK}$ for transmission, for example, in an IoT network.

Under certain operation conditions, the charge pump circuit 66 may be configured to generate the current $I_{CC}$ in the same amount as the load current $I_{LOAD}$. Alternatively, as discussed next in FIG. 3, it may also be possible to configure the charge pump circuit 66 to generate the current $I_{CC}$ as one-half (½) of the load current $I_{LOAD}$ and use a second charge pump circuit to generate the other half of load current $I_{LOAD}$.

Figure 3:
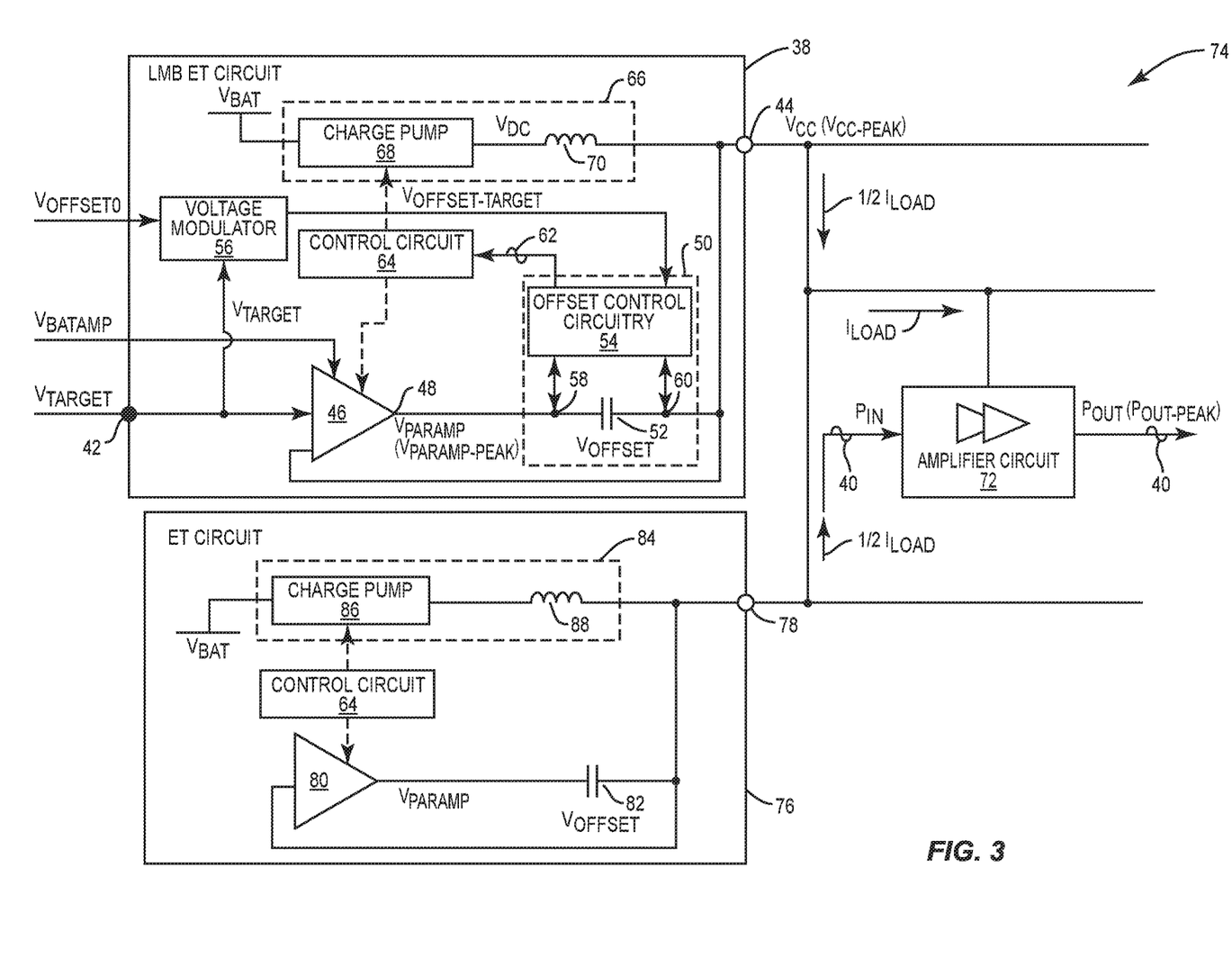
FIG. 3 is a schematic diagram of an exemplary circuit including a second ET circuit in addition to the LMB ET circuit of FIG. 2.

In this regard, FIG. 3 is a schematic diagram of an exemplary circuit 74 including a second ET circuit 76 in addition to the LMB ET circuit 38 of FIG. 2. Common elements between FIGS. 2 and 3 are shown therein with common element numbers and will not be re-described herein.

The second ET circuit 76 includes a second output node 78 coupled to the amplifier circuit 72. The second ET circuit 76 includes a second amplifier 80, which is coupled to the second output node 78 via a second offset capacitor 82. The second ET circuit 76 includes a second charge pump circuit 84, which includes a second charge pump 86 and a second inductor 88. The second ET circuit 76 may or may not be the same as the LMB ET circuit 38. In this regard, the second ET circuit 76 may or may not include the offset circuit 50 and the voltage modulator 56 like the LMB ET circuit 38 does.

In a non-limiting example, the charge pump circuit 66 and the second charge pump circuit 84 can be configured to each generate one-half (½) of the load current $I_{LOAD}$ required by the amplifier circuit 72 for amplifying the LMB RF signal 40. The second amplifier 80 is not required to generate the ET modulated voltage $V_{CC}$ for the amplifier circuit 72 and can thus be deactivated.

Those skilled in the art will recognize improvements and modifications to the preferred embodiments of the present disclosure. All such improvements and modifications are considered within the scope of the concepts disclosed herein and the claims that follow.

What is claimed is:

1. A low modulation bandwidth (LMB) envelope tracking (ET) circuit comprising:
   an input node configured to receive a modulated target voltage;
   an output node configured to output an ET modulated voltage corresponding to the modulated target voltage;
   an amplifier configured to generate a modulated amplifier voltage at an amplifier output based on the modulated target voltage; and
   an offset circuit comprising an offset capacitor and offset control circuitry coupled in parallel to the offset capacitor between the amplifier output and the output node, the offset circuit configured to:
      receive a modulated target offset voltage proportional to the modulated target voltage; and
      cause a modulated offset voltage to be generated between the amplifier output and the output node based on the modulated target offset voltage such that the ET modulated voltage is maintained at a defined voltage level for a defined duration.

2. The LMB ET circuit of claim 1 further comprising a voltage modulator coupled to the offset circuit and configured to:
   receive the modulated target voltage from the input node;
   scale the modulated target voltage based on a predefined scaling factor to generate a scaled modulated target voltage;
   modulate the scaled modulated target voltage with a predefined minimum offset voltage to generate the modulated target offset voltage proportional to the modulated target voltage; and
   provide the modulated target offset voltage to the offset circuit.

3. The LMB ET circuit of claim 2 wherein the predefined scaling factor is greater than zero and less than one.

4. The LMB ET circuit of claim 2 wherein:
   the offset capacitor has a first end coupled to the amplifier output and a second end coupled to the output node; and
   the offset control circuitry is coupled in parallel to the offset capacitor between the first end and the second end, wherein the offset control circuitry is configured to:
      receive the modulated target offset voltage from the voltage modulator;
      determine the modulated offset voltage based on the modulated target offset voltage; and
      apply the modulated offset voltage across the offset capacitor.

5. The LMB ET circuit of claim 4 wherein the offset control circuitry is further configured to:
   receive the modulated amplifier voltage and the ET modulated voltage from the first end and the second end, respectively;
   determine a voltage differential between the ET modulated voltage and the modulated amplifier voltage; and
   generate an indication signal indicative of the voltage differential.

6. The LMB ET circuit of claim 5 further comprising a control circuit configured to:
   receive the indication signal from the offset control circuitry; and
   control the amplifier based on the voltage differential indicated by the indication signal.

7. The LMB ET circuit of claim 6 further comprising a charge pump circuit configured to provide a current to the output node.

8. The LMB ET circuit of claim 7 wherein the charge pump circuit comprises:
   a charge pump configured to generate a direct current (DC) voltage based on a battery voltage; and
   an inductor coupled between the charge pump and the output node, the inductor is configured to generate the current at the output node based on the DC voltage.

9. The LMB ET circuit of claim 8 wherein the charge pump is further configured to generate the DC voltage at 0 volt, at the battery voltage, or at two times the battery voltage.

10. The LMB ET circuit of claim 9 wherein the battery voltage is less than or equal to 3.2 volts.

11. The LMB ET circuit of claim 7 wherein the control circuit comprises:
   a bang-bang controller configured to control the charge pump circuit; and
   an ET controller configured to control the amplifier.

12. The LMB ET circuit of claim 7 wherein:
the output node is coupled to an amplifier circuit configured to amplify an LMB radio frequency (RF) signal based on the ET modulated voltage and a load current; and
the offset circuit is further configured to cause the modulated offset voltage to be generated between the amplifier output and the output node such that the ET modulated voltage is maintained at the defined voltage level for the defined duration required to amplify the LMB RF signal to a defined power level.

13. The LMB ET circuit of claim 12 wherein the LMB RF signal corresponds to a modulation bandwidth less than 180 KHz.

14. The LMB ET circuit of claim 12 wherein the charge pump circuit is further configured to generate the current that equals one-half of the load current.

15. The LMB ET circuit of claim 14 wherein the amplifier circuit is further coupled to a second charge pump circuit configured to generate another one-half of the load current.

16. The LMB ET circuit of claim 2 wherein the modulated target offset voltage comprises a static term and a dynamic term.

17. The LMB ET circuit of claim 16 wherein the static term is determined based on the predefined minimum offset voltage and a scaled minimum target voltage.

18. The LMB ET circuit of claim 16 wherein the dynamic term corresponds to the scaled modulated target voltage.

19. The LMB ET circuit of claim 1 wherein the offset circuit is further configured to cause the modulated offset voltage to be generated between the amplifier output and the output node such that the ET modulated voltage is maintained at a peak level for the defined duration.

20. The LMB ET circuit of claim 19 wherein the offset circuit is further configured to cause the modulated offset voltage to be generated between the amplifier output and the output node to maintain a positive voltage headroom when the ET modulated voltage is maintained at the peak level.

* * * * *